United States Patent [19]

Sakurai

[11] 4,455,566
[45] Jun. 19, 1984

[54] HIGHLY INTEGRATED SEMICONDUCTOR MEMORY DEVICE

[75] Inventor: Junji Sakurai, Tokyo, Japan

[73] Assignee: Fujitsu Limited, Kawasaki, Japan

[21] Appl. No.: 159,505

[22] Filed: Jun. 16, 1980

[30] Foreign Application Priority Data

Jun. 18, 1979 [JP] Japan .................................. 54-76568
Jun. 27, 1979 [JP] Japan .................................. 54-80971

[51] Int. Cl.³ ..................... H01L 27/02; H01L 29/78; H01L 29/04
[52] U.S. Cl. .................................... 357/41; 357/23.4; 357/23.6; 357/23.11; 357/59; 357/89; 357/91
[58] Field of Search .................. 357/23 C, 23 VD, 24, 357/41

[56] References Cited

U.S. PATENT DOCUMENTS

| | | | |
|---|---|---|---|
| 4,060,738 | 11/1977 | Tasch et al. | 357/24 R |
| 4,203,125 | 5/1980 | Chatterjee et al. | 357/23 C |
| 4,280,855 | 7/1981 | Bertin et al. | 357/23 VD |
| 4,325,180 | 4/1982 | Curran et al. | 357/23 VD |
| 4,329,704 | 5/1982 | Sakurai et al. | 357/23 C |

OTHER PUBLICATIONS

Cauge et al., "Double-Diffused MOS Transistor Achieves Microwave Gain" Electronics (Feb. 15, 1971), pp. 99–104.

Primary Examiner—Gene M. Munson
Attorney, Agent, or Firm—Staas & Halsey

[57] ABSTRACT

A highly integrated semiconductor memory device of a DMOS type, in which one half of the surface area in each memory cell is used as the drain region and another half is used as the gate electrode. The channel region and the source region are formed under the gate electrode so that, the size required by one memory cell is $4F^2$, where F represents the minimum width of a patterning line.

30 Claims, 21 Drawing Figures

HIGHLY INTEGRATED SEMICONDUCTOR MEMORY DEVICE

BACKGROUND OF THE INVENTION

1. Field of the Invention

The present invention relates to a highly integrated semiconductor memory device, and more particularly, to a memory cell of a buried-storage type the size of which is minimized.

2. Description of the Prior Art

In the field of semiconductor devices, it has been attempted to decrease the size of the device as much as possible. For example, in a RAM cell (Random-Access Memory Cell) of a 1-transistor cell type, including one transistor and one storage capacitor, a buried-storage technique was employed for minimization of the cell. In such a buried-storage type 1-transistor RAM cell, the storage capacitor is buried under an epitaxial layer formed on a silicon substrate. Therefore, the capacitor region is not exposed on the surface of the cell and also, the size of the cell is reduced by the size of the capacitor. As a result, as hereinafter described in detail, the area of the device is $8F^2$, where "F" represents both the minimum width of a patterning line and the minimum width of the spacing between two adjacent patterning lines The value "F" is determined by the lithography technique. For example, when using optical lithography means, the value "F" is on the order of two micrometers, and when using electron-beam exposure means, the value "F" is on the order of one-half micrometer.

The size of the buried-storage type 1-transistor cell has been further reduced by using a VMOS technique. In the VMOS-type 1-transistor cell, the required size is smaller than $8F^2$. However, it is desirable to minimize the size of the 1-transistor cell even further. In addition, it is very difficult to manufacture the VMOS-type 1-transistor cell because of its special structure having a pyramid-shaped hole.

Figure 1:
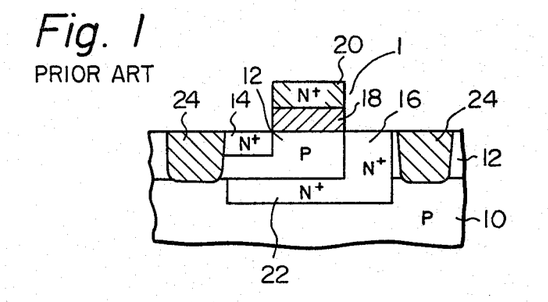
FIG. 1 illustrates a cross-sectional view of a buried-storage type 1-transistor RAM cell of the prior art.

FIG. 1 illustrates a cross-sectional view of a buried-storage type 1-transistor RAM cell 1 of the prior art. In FIG. 1, an N+-type buried layer 22 is formed by diffusion at the surface of a P-type silicon semiconductor substrate 10. A P-type epitaxial layer 12 is formed on the N+-type buried layer 22 and on the P-type silicon semiconductor substrate 10. Field-oxide regions 24 for isolating the cell 1 from neighboring cells are formed by diffusion into the P-type epitaxial layer 12. An N+-type gate electrode 20 is formed through a gate-oxide layer 18, which serves to insulate the gate electrode 20 from the P-type epitaxial layer 12. An N+-type drain region 14 and an N+-type source region 16 are formed by diffusion at the surface of the P-type epitaxial layer 12 and at both sides of the gate electrode 20. The junction capacitance between the N+-type buried layer 22 and the surrounding P-type region of the silicon substrate 10 and the epitaxial layer 12, acts as a charge-storage region. Thus, the buried-storage type 1-transistor RAM cell 1 of FIG. 1 is constructed to include one planar-type transistor and one buried-storage capacitor.

Figure 2:
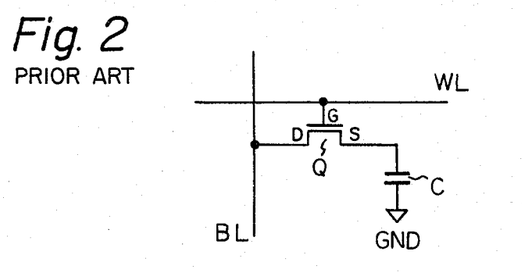
FIG. 2 is an equivalent circuit diagram of the cell of FIG. 1.

An equivalent circuit diagram of the buried-storage type 1-transistor RAM cell 1 of FIG. 1 is illustrated in FIG. 2, wherein cell 1 comprises a MOS transistor Q and a capacitor C. A gate G, a drain D and a source S of the transistor Q are connected respectively to a word line WL, a bit line BL and one electrode of the capacitor C. The other electrode of the capacitor C is grounded. In operation, when information designated "1" is to be stored in cell 1, the cell is activated by the word line WL and the bit line BL so as to turn on the MOS transistor Q and thus charge capacitor C. When information designated "0" is to be stored in the cell 1, the cell is not activated and no charge is stored in the capacitor C. In order to read out the information stored in the cell 1, gate G is opened and the electric potential of the bit line BL is detected by a sense amplifier. If the information "1" is stored in the cell 1 capacitor C will discharge thus changing the electrical potential detected at bit line BL. If the information "0" is stored in the cell 1, no discharge occurs and the potential is not changed.

Figure 3:
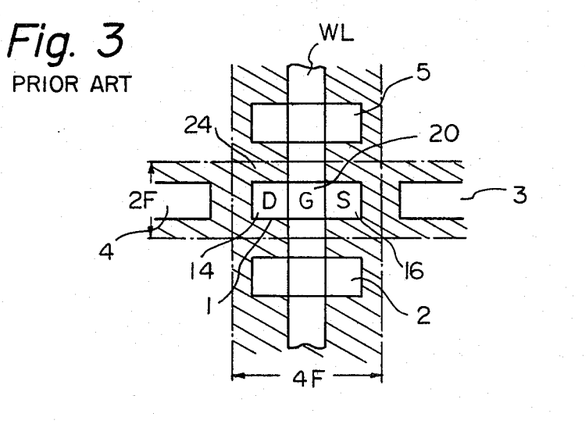
FIG. 3 illustrates a plan view of the cell of FIG. 1.

FIG. 3 is a plan view of the buried-storage type 1-transistor RAM cell 1 of FIG. 1. The cell 1 is positioned in the center portion of FIG. 3. Cell 1 comprises the N+-type drain region 14, the gate electrode 20 and the N+-type source region 16 arranged in a series in the transverse direction or horizontal direction as shown in FIG. 3. The gate electrode 20 is connected to the word line WL extending in the longitudinal direction or vertical direction as shown in FIG. 3. On the periphery of the cell 1, neighboring cells 2, 3, 4, and 5 are positioned around cell 1. Cells 1, 2, 3, 4 and 5 are isolated from each other by the field-oxide regions 24 (hatched areas in FIG. 3), which serve as isolation regions.

The drain region 14, the gate electrode 20 and the source region 16 each has a square shape with a side length of "F". The value "F" is both the minimum width of a patterning line and the minimum width of the spacing between two adjacent patterning lines. Therefore, the size of cell 1 is 1F in the longitudinal direction and 3F in the transverse direction. The distance between the cell 1 and each of the neighboring cells 2 through 5 is also "F". As a result, taking into account the field-oxide regions 24, the size of the surface area for the cell 1 is 4F in the transverse direction and 2F in the longitudinal direction. Consequently, the surface area required by one cell of FIG. 3 is $8F^2$.

Figure 4:
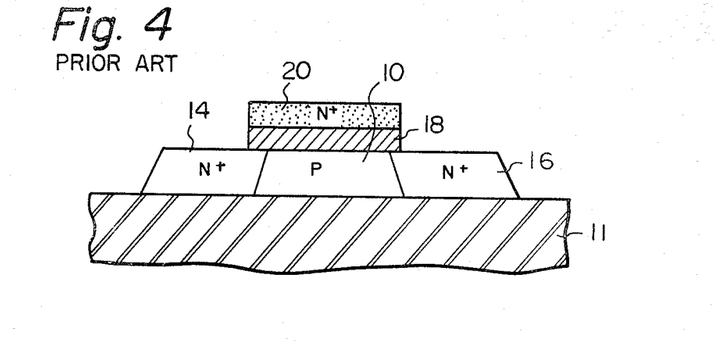
FIG. 4 illustrates a cross-sectional view of a charge-pumping type memory cell of the prior art.

The surface area of $8F^2$ is also required by a memory cell of a charge-pumping type in FIG. 4. FIG. 4 illustrates a cross-sectional view of a charge-pumping type memory cell of the prior art. In FIG. 4, a P-type silicon substrate 10 is formed as an island in a floating state on a sapphire substrate 11. A gate-oxide layer 18 is formed on the P-type silicon substrate 10. An N+-type gate electrode 20 is formed on the gate-oxide layer 18. An N+-type drain region 14 and an N+-type source region 16 are formed adjacent the silicon substrate 10. Thus, an N-channel type MOS FET having a so-called SOS (Silicon-On-Sapphire) structure is constructed.

In order to store information designated "1" in this SOS-type MOS FET, a well-known charge pumping from the inverstion layer into the channel region 10 is effected. The information designated "1" or "0" stored in a SOS-type MOS FET can be determined by detecting a current conducted between the N+-type drain region 14 and the N+-type source region 16 when a voltage is applied between them. In order to erase the stored information, a well-known avalanche breakdown is effected at the N+-type drain region 14 by applying a high voltage of, for example, 9 V to the N+-type drain region 14. These charge-pumping type memory devices are described in more detail in U.S. Pat. No. 4,250,569, issued on Feb. 10, 1981, and in IEEE Transaction on Electron Devices Vol ED-16 No. 3, March 1969 "Charge Pumping in MOS Devices".

As mentioned before, the surface area of this SOS-type MOS FET is also $8F^2$. Accordingly, the plan view of the SOS-type MOS FET can also be illustrated as in FIG. 3.

In order to realize a large scale integrated memory, it is required that the size of a memory cell be as small as possible.

SUMMARY OF THE INVENTION

It is therefore the primary object of the present invention to provide a highly integrated semiconductor device.

It is another object of the invention to provide a dynamic memory cell the surface area of which is minimized.

It is still another object of the invention to provide a buried-storage type 1-transistor cell, the surface area of which is minimized.

It is still another object of the invention to provide a charge pumping memory cell, the surface area of which is minimized.

It is still another object of the invention to provide a read-only memory, the surface area of which is minimized.

It is still another object of the invention to provide a random access memory, the surface area of which is minimized.

It is still another object of the invention to provide a semiconductor memory cell, the surface area of which is reduced to $4F^2$.

According to the present invention, there is provided a semiconductor memory device including a plurality of memory cells formed on a semiconductor substrate of one conductivity type, each of said memory cells comprising: a first region having an opposite conductivity type with respect to said semiconductor substrate and formed on said semiconductor substrate; a gate-oxide layer formed on said first region except on a window for diffusing impurities therethrough; a gate electrode formed on said gate-oxide layer; a second region having the same conductivity type as said semiconductor substrate and formed under said window by diffusing impurities through said window into said first region, said second region extending to a protion under a part of said gate electrode, and; a third region having the same conductivity type as said first region and formed on said second region under said window by diffusing impurities through said window into said second region, said gate electrode covering, through said gate-oxide layer, the surface of said first region and said second region.

There is also provided, according to another embodiment, a semiconductor memory device including a plurality of memory cells formed on a semiconductor substrate of one conductivity type, each of said memory cells comprising: a first region having the same conductivity type as said semiconductor substrate and formed on said semiconductor substrate; a gate-oxide layer formed on said first region except on a window for diffusing impruities therethrough; a gate electrode formed on said gate-oxide layer; a second region having an opposite conductivity type as said semiconductor substrate and formed under said window by diffusing impurities through said window into said first region, said second region extending to a portion under a part of said gate electrode, and; a third region having the same type of conductivity as said first region and formed on said second region under said window, by diffusing impurities through said window into said second region, said gate electrode covering, through said gate-oxide layer, the surface of said first region and said second region.

BRIEF DESCRIPTION OF THE DRAWINGS

The foregoing objects and other objects as well as the characteristic features of the invention will become more apparent and more readily understandable by the following description relating to the accompanying drawings, in which like reference characters and numerals designate the same or similar parts throughout the figures and wherein.

DESCRIPTION OF THE PREFERRED EMBODIMENTS

The preferred embodiments of the present invention will now be described in detail with reference to FIGS. 5A through 5H, 6A through 6E, FIG. 7, FIGS. 8A and 8B, and FIG. 9.

Figure 5A:
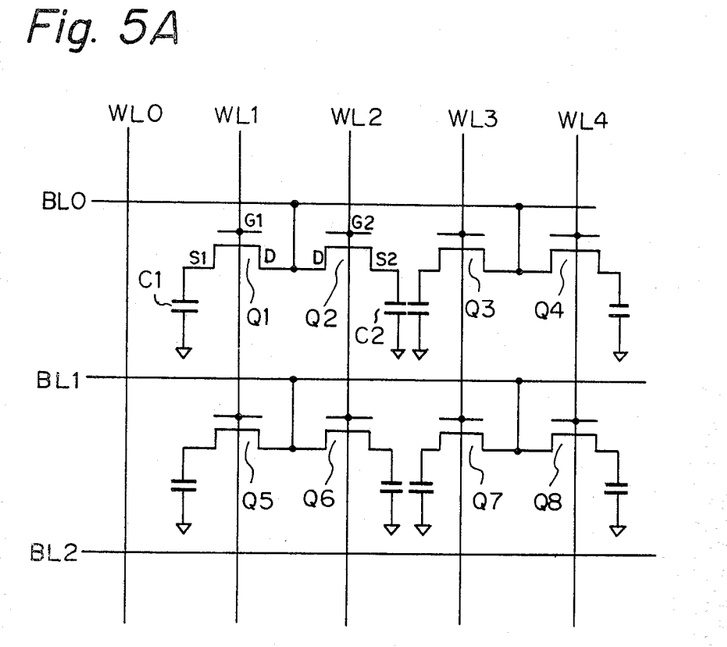
FIG. 5A is a circuit diagram of a highly integrated semiconductor memory device according to one embodiment of the present invention.

FIG. 5A is a circuit diagram of a highly integrated semiconductor memory device according to one embodiment of the present invention. In FIG. 5A, only eight MOS transistors Q1 through Q8 are illustrated. However, there are, in practice, a number of MOS transistors connected to a number of word lines and bit lines. Gates G1 and G2 of two adjacent MOS transistors Q1 and Q2 are connected respectively to the word lines WL1 and WL2. Sources S1 and S2 of the transistors Q1 and Q2 are connected respectively to one end of capacitors C1 and C2. The other end of each of the capacitors C1 and C2 is grounded. Each drain D of the transistors Q1 and Q2 is connected to one another. Other pairs of adjacent transistors are also connected in a similar way.

Figure 5B:
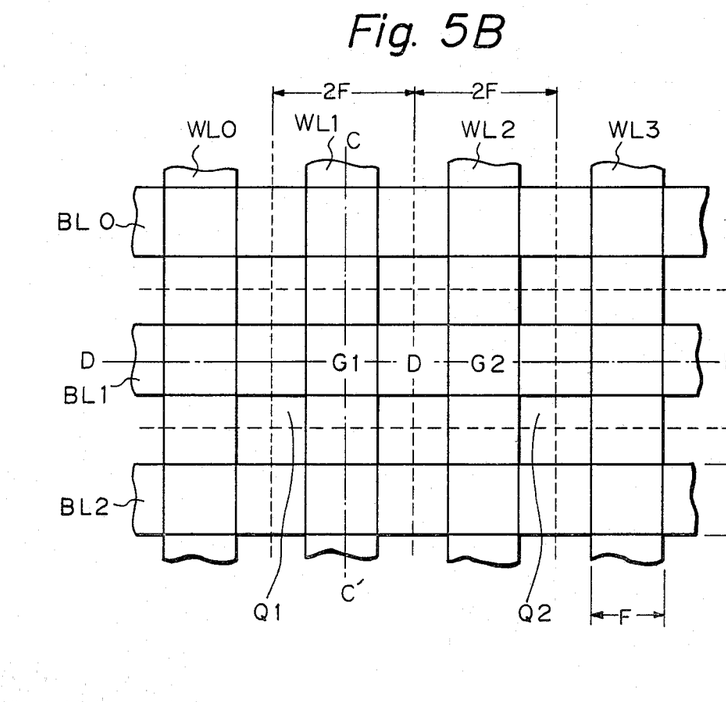
FIG. 5B illustrates a partial plan view of the semiconductor device of FIG. 5A.

FIG. 5B illustrates a partial plan view of the semiconductor device of FIG. 5A. In FIG. 5B, bit lines BL0, BL1, BL2, . . . are arranged in parallel and extend in a transverse direction or horizontally as depicted in the figure. Word lines WL0, WL1, WL2, . . . are arranged in parallel and extend in the longitudinal direction or vertically as depicted in the figure. Each of the bit lines and the work lines has a width "F" which is the minimum width of a patterning line. The bit lines BL0, BL1, . . . as well as the word lines WL0, WL1, . . . are separated from each other by the same width "F". Each cross section of a bit line and a word line is a gate region G of a memory cell. The cross portion of the bit line BL1 and the word line WL1 is the gate region G1 of the MOS transistor Q1. Also, the cross portion of the bit line BL1 and the word line WL2 is the gate region G2 of the transistor Q2. Between the gate regions G1 and G2 on the bit line BL1, the common drain region D is represented. The source regions S1, S2 . . . and the capacitors $C_1$, $C_2$, . . . are buried under the respective gate regions G1, G2, . . . and thus do not appear in the plan view of FIG. 5B.

As will be apparent from the following description, the area required by one memory cell is a square as illustrated in FIG. 5B by dotted lines. Since one side length of the square is 2F, the area of the square is $4F^2$. Therefore, in comparison with the area ($8F^2$) required by one memory cell of the prior art, the area required by one memory cell according to the present invention is reduced by a considerable amount, i.e. $4F^2$.

Figure 5C:
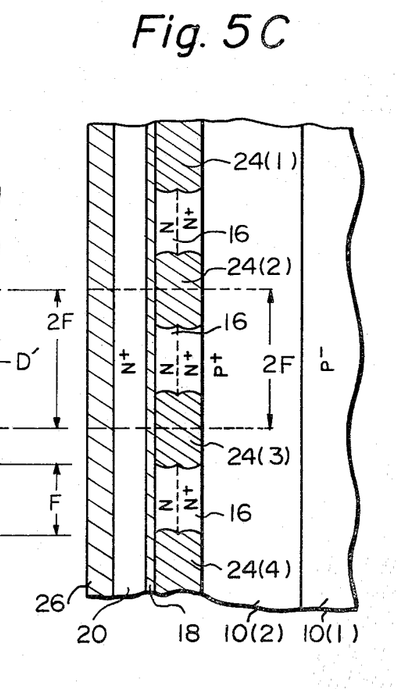
FIG. 5C illustrates a cross-sectional view taken along the line C-C' of the semiconductor device of FIG. 5B.

FIG. 5C is a cross-sectional view taken along the line C-C' of the semiconductor device of FIG. 5B. FIGS. 5D through 5H are cross-sectional views taken along the line D-D' of the semiconductor device of FIG. 5B, for explaining the manufacturing steps of the semiconductor device of FIG. 5B. The method for manufacturing the semiconductor device of FIG. 5B will now be described.

Figure 5D:
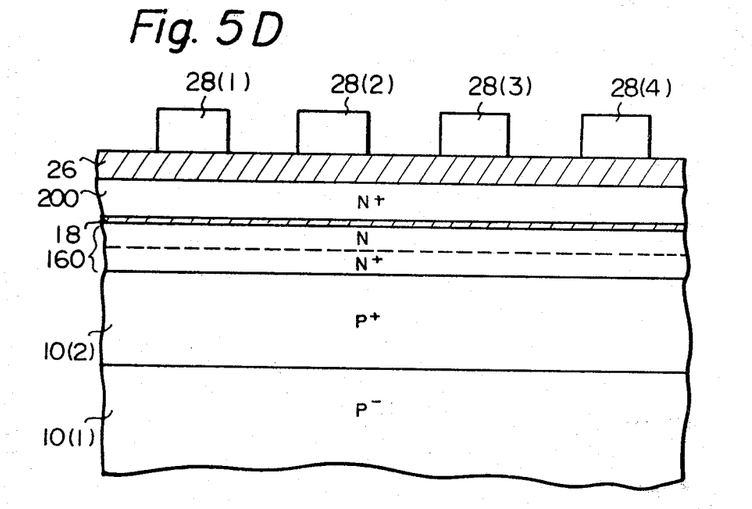
FIGS. 5D through 5H illustrate cross-sectional views taken along the line D-D' of the semiconductor device of FIG. 5B, for explaining the manufacturing steps of the semiconductor device.

(1) On a $P^-$-type silicon semiconductor substrate 10(1) having a resistivity of about 20 ohm.cm, P-type impurities, such as boron ions, are implanted deeply with a projected range of about one micrometer to form a $P^+$-type region 10(2) with a high concentration of $1 \times 10^{18}/cm^3$ as illustrated in FIGS. 5C and 5D.

(2) On the $P^-$-type silicon substrate 10(1), N-type impurities, such as phosphorus ions, are implanted deeply with a projected range of about one half micrometer to form an N-type layer 160 as illustrated in FIG. 5D. By this deep implantation of the N-type impurities, the lower portion of the N-type layer 160 has a high concentration of impurities of about $1 \times 10^{18}/cm^3$, and the upper portion of the N-type layer 160 has a low concentration, as illustrated in FIG. 5D by the notation "N+" and "N" respectively. This N-type layer 160 may alternatively be formed by an epitaxial-growth method or diffusion of impurities.

(3) After forming the N-type layer 160, isolation regions 24(1), 24(2), 24(3), 24(4), . . . for isolating memory cells from each other in the longitudinal direction are formed by diffusing $P^3$-type impurities or by embedding silicon dioxide into the regions corresponding to the spaces between bit lines, as illustrated in FIG. 5C.

(4) After forming the isolation regions 24(1), 24(2), 24(3), . . . a gate-oxide layer 18 for insulating gate electrodes is formed with a thickness of about 500 Å to cover the N-type layer 160 and the isolation regions 24(1), 24(2), 24(3), . . . as illustrated in FIGS. 5C and 5D.

(5) After forming the gate-oxide layer 18, a polysilicon layer 200 for gate electrodes is formed with a thickness of about 0.4 micrometer. Arsenic ions with a concentration of about $5 \times 10^{20}/cm^3$ are doped into the polysilicon 1 layer 200. Thus, the polysilicon layer 200 is of N+ type as illustrated in FIGS. 5C and 5D.

(6) After forming the polysilicon layer 200, a silicon-dioxide insulating layer 26 with a thickness of about 0.3 micrometer is formed by a CVD (Chemical-Vapour Deposition) method or a thermal-growing method, as illustrated in FIGS. 5C and 5D.

Figure 5E:
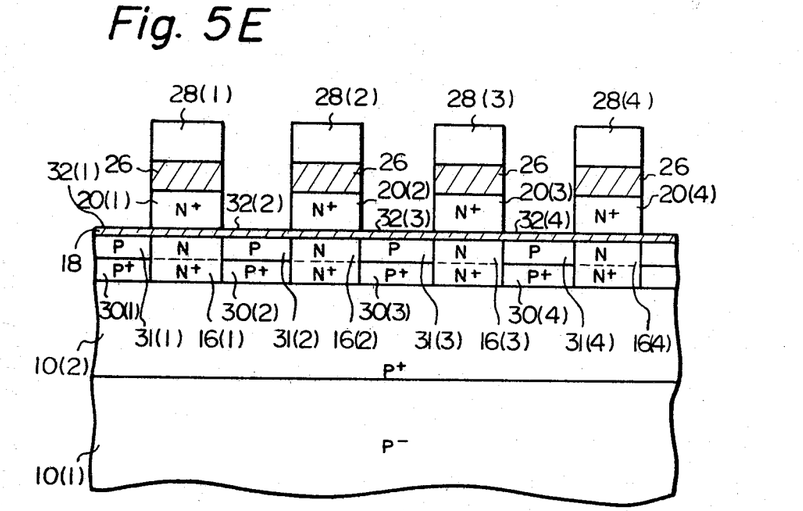

(7) After the silicon-dioxide insulating layer 26 is formed, the insulating layer 26 is covered by resist masks 28(1), 28(2), 28(3), 28(4), . . . for patterning the polysilicon layer 200. Each of the resist masks 28(1), 28(2), 28(3), 28(4), . . . has a width of F. The resist masks 28(1), 28(2), 28(3), 28(4), . . . are spaced apart from each other by a distance F. Then, the regions where no resist mask is present are etched away until the surface of the gate-oxide layer 18 is exposed as illustrated in FIG. 5E. As a result of this etching, the polysilicon layer 200 is divided into a number of gate electrodes 20(1), 20(2), 20(3), 20(4), . . . as illustrated in FIG. 5E.

(8) After this, boron ions are implanted deeply with a projected range of about 0.5 micrometer to form $P^+$-type regions 30(1), 30(2), 30(3), 30(4), . . . with a concentration of about $5 \times 10^{18}/cm^3$ as illustrated in FIG. 5E.

(9) After this, shallow implantation of boron ions is effected with a projected range of about 500 Å to form P-type regions 31(1), 31(2), 31(3), 31(4), . . . with a concentration of about $1 \times 10^{17}/cm^3$ as illustrated in FIG. 5E. As a result of steps (8) and (9), the N-type layer 160 is divided into a number of N-type source regions 16(1), 16(2), 16(3), 16(4), . . . which are arranged, respectively, under the resist masks 28(1), 28(2), 28(3), 28(4), . . . . The $P^+$- and P-type regions 30(1), 30(2), 30(3), . . . and 31(1), 31(2), 31(3), 31(4), . . . respectively, and the N-type source regions 16(1), 16(2), 16(3), 16(4), . . . are thus arranged alternately as illustrated in FIG. 5E.

Figure 5F:
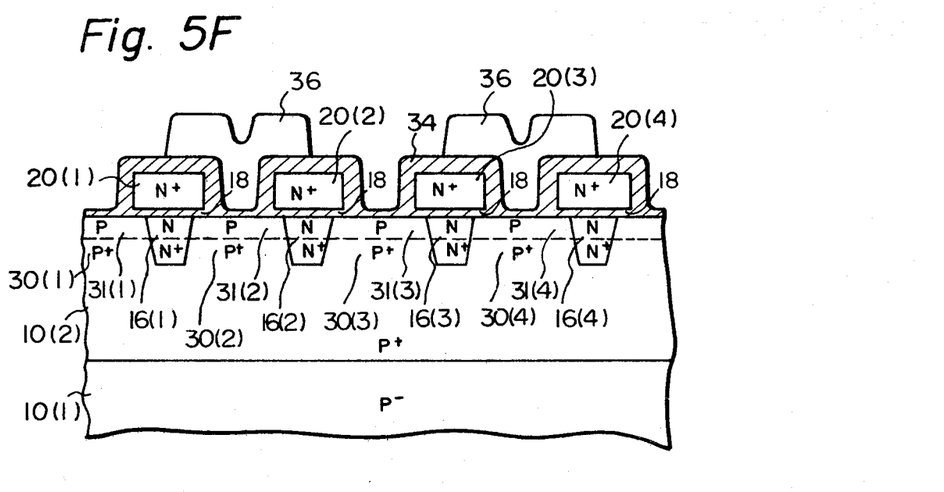

(10) After the $P^+$-type regions 30(1), 30(2), 30(3), 30(4), . . . , the P-type regions 31(1), 31(2), 31(3), 31(4), . . . and the N-type source regions 16(1), 16(2), 16(3), . . . are formed, the implanted $P^+$ and P-type regions 30(1), 30(2), 30(3), . . . , and 31(1), 31(2), 31(3), . . . , respectively, are thermally diffused so that each of the N-type source regions 16(1), 16(2), 16(3), . . . , is narrowed as illustrated in FIG. 5F. Since the concentration of impurities in the upper portion of each N-type source region 16(1), 16(2), 16(3), . . . , is lower than the concentration of impurities in the lower portion, each of the $P^+$-type regions 30(1), 30(2), 30(3), . . . is diffused to become wider than each of the P-type regions 31(1), 31(2), 31(3), . . . . Therefore, as illustrated in FIG. 5F, each of the N-type source regions 16(1), 16(2), 16(3), . . . has a trapezoidal shape.

(11) After etching off the silicon-dioxide films 18 at the regions 32(1) . . . 32(4), the resist masks 28(1), 28(2), 28(3), . . . are removed. Then, in a wet atmosphere and at a low temperature of about 850° C., a silicon-dioxide film with a thickness of about 0.3 micrometer is grown on each of the patterned heavily doped N+-type gate electrodes 20(1), 20(2), 20(3), . . . and a silicon-dioxide film with a thickness of about 500 Å is grown on each of the lightly doped etched regions 32(1), 32(2), 32(3), 32(4), . . . As a result, each of the N+-type gate electrodes 20(1), 20(2), 20(3), . . . is surrounded by a thick silicon-dioxide film 34 as illustrated in FIG. 5F.

(12) Then, phospho-silicate glass (PSG) layers 36 are positioned to cover the N+-type gate electrodes 20(1), 20(2), 20(3), . . . over the silicon-dioxide film 34 in such a way that alternate spaces between two adjacent N+-type gate regions 20, for example, between the gate electrodes 20(2) and 20(3) in FIG. 5F, are not covered by the PSG layer 36 as illustrated in FIG. 5F.

Figure 5G:
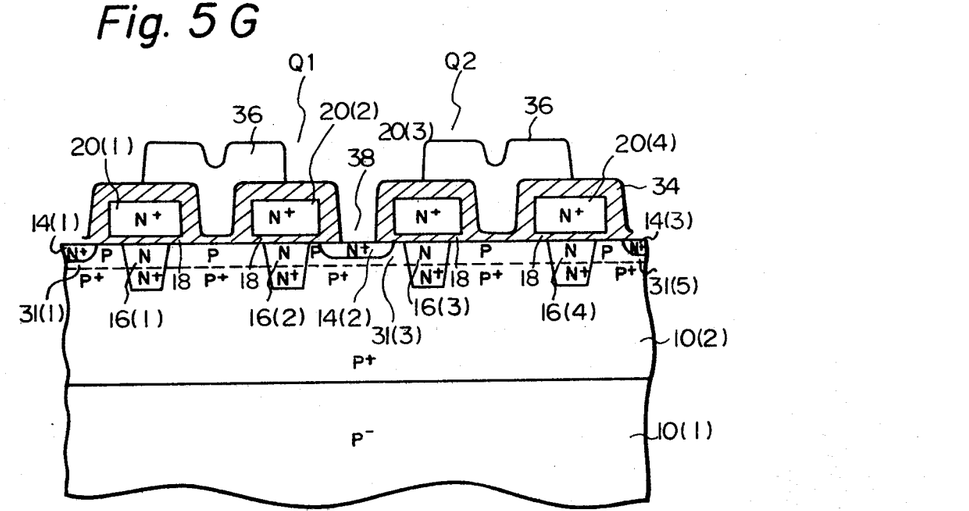

(13) After forming the PSG layers 36, the PSG layers are used as masks for etching the silicon-dioxide film 34 to a depth of about 500 Å. As a result, contact windows 38 are formed on the surfaces of the alternate P-type regions 31(1), 31(3), 31(5), . . . so that these surfaces are exposed, as illustrated in FIG. 5G. The contact windows 38 are used for diffusing impurities therethrough as well as for contacting with bit lines as hereinafter described. In FIG. 5G, only one contact window 38 is completely illustrated, but in practice, there may be many contact windows.

(14) Then, arsenic ions are implanted with a projected range depth of about 500 Å through the contact windows 38 into the alternate P-type regions 31(1), 31(3), 31(5), . . . so that N+-type drain regions 14(1), 14(2), 14(3), . . . with a concentration of about $5 \times 10^{20}/cm^3$ are formed as illustrated in FIG. 5G. The N+-type drain regions 14(1), 14(2), 14(3), . . . are used in the same way as drain regions commonly used by two adjacent MOS transistors, for example, Q1 and Q2.

(15) After this, annealing is effected to activate implanted impurities. Reflow of the PSG layer 36 is then effected.

Figure 5H:
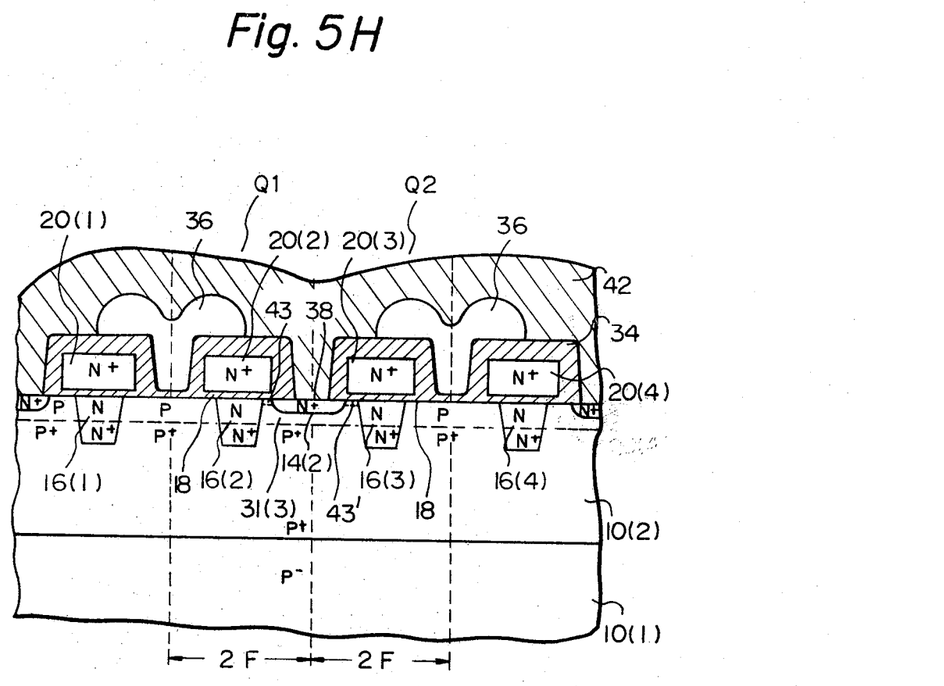

(16) Then, aluminum is deposited on the entire surface of the device forming an aluminum layer 42 as illustrated in FIG. 5H. Finally, a patterning is effected on the aluminum layer 42 in a conventional manner.

Thus, the semiconductor device according to this first embodiment is manufactured. FIG. 5H illustrates a part of the cross-sectional structure of the semiconductor device of this embodiment. In FIG. 5H, the N+-type drain region 14(2) is connected to the aluminum layer 42. The aluminum layer 43 corresponds to the bit line BL1 of FIG. 5B. Two adjacent MOS transistors Q1 and Q2 are illustrated in FIG. 5H. The N-type source region 16(2) acts as a source region of the MOS transistor Q1. Similarly, the N-type region 16(3) acts as a source region of the MOS transistor Q2. The capacitance in the PN junction between the P+-type silicon substrate 10(2) and the N-type source region 16(2) corresponds to the capacitor C1 of FIG. 5A. Also, the capacitance in the PN junction between the P+-type silicon substrate 10(2) and the lower portion of the N-type source region 16(3) corresponds to the capacitor C2 of FIG. 5A. In order to store sufficient charges in the capacitor, the lower portion of the N-type region 16(2) has a relatively high concentration of impurities. A channel region 43 of the MOS transistor Q1 is formed between the N-type source region 16(2) and the N+-type drain region 14(2), at the surface of the P-type region 31(3), and under the gate electrode 20(2) through the gate oxide layer 18 as illustrated by a transverse dotted line. Also, a channel region 43' of the MOS transistor Q2 is formed between the N-type source region 16(3) and the N+-type region 14(12), at the surface of the P-type region 31(3), and under the gate electrode 20(3) through the gate-oxide layer 18. It should be noted that, according to this embodiment, the area required by one memory cell is only $4F^2$. This will be apparent with reference to FIGS. 5C and 5H. In FIG. 5C, the length of the longitudinal side of the transistor Q1 or Q2 is 2F. In FIG. 5H, the length of the transverse side of the transistor Q1 or Q2 is 2F. Therefore, the area for one memory cell is 2F×2F.

Figure 6A:
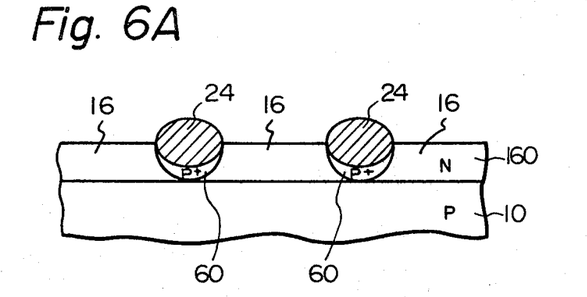
FIGS. 6A through 6D illustrate cross-sectional views of a semiconductor device according to the second embodiment, for explaining the manufacturing steps of the semiconductor device.

The manufacturing process for another embodiment of the present invention is described with reference to FIGS. 6A through 6C. In FIG. 6A, an N-type layer 160 is formed on a P-type silicon semiconductor substrate 10 by an epitaxial growth or diffusion of impurities. P+-type channel cut regions 60 for isolating channel regions of two adjacent memory cells from each other are then formed in the N-type layer 160 so that the N-type layer 160 is divided into several N-type source regions 16. Isolation regions 24 for isolating memory cells from each other are formed on the P+-type channel cut regions 60. Then, a gate-oxide layer (not shown in FIG. 6A) is formed by thermal oxidation to cover the entire surface of the N-type source regions 16 and the isolation regions 24. A polysilicon layer (not shown in FIG. 6A) is then formed on the gates oxide layer by a CVD method.

Figure 6B:
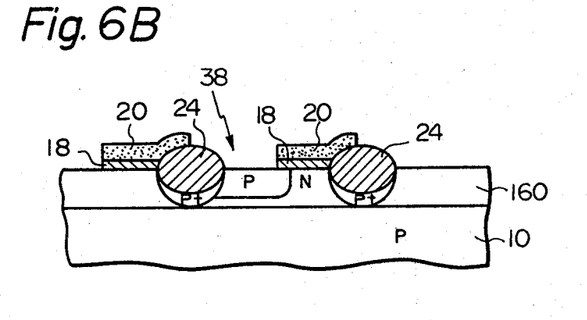
Figure 6C:
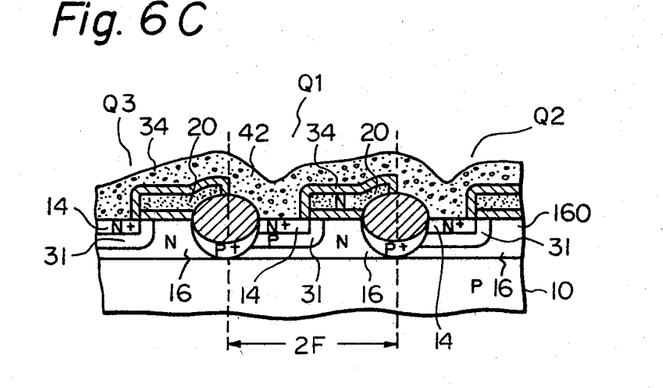

Then, as illustrated in FIG. 6B, the gate-oxide layer and the polysilicon layer are subjected to patterning so that gate-oxide regions 18 and gate electrodes 20 are formed in such a way that each of the gate oxide regions 18 and gate electrodes 20 are formed on one half of an active region surrounded by two adjacent isolation regions 24. The other half of the said active region is used as a window 38 for impurity diffusion. The length of each half of the said active region is F. Therefore, the size of the width required by one cell is 2F.

Figure 6D:
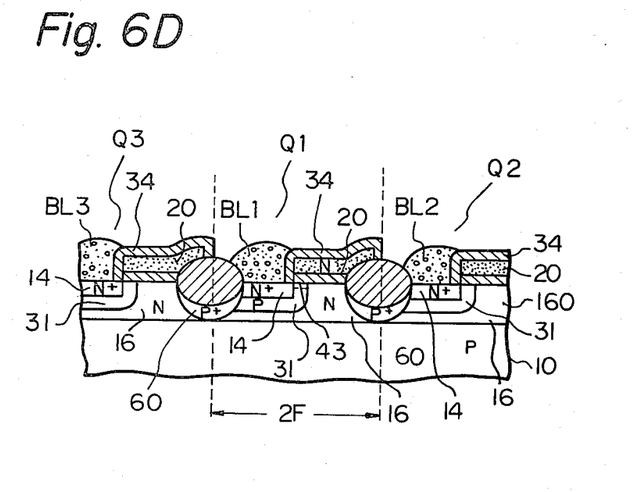

Then, P-type impurities are diffused deeply through the windows 38. After this, shallow diffusion of N+-type impurities is performed through the same windows 38. Thus, as illustrated in FIG. 6C, a P-type region 31 and an N+-type drain region 14 are formed under each window 38. Then, a silicon-dioxide film 34 is covered on each gate electrode 20 in such a way as explained hereinbefore in reference to the first embodiment. An aluminum layer 42 is then formed and a patterning is performed in the conventional manner to form bit lines BL1, BL2, BL3, . . . as illustrated in FIG. 6D. Word lines (not shown) are connected to respective gate electrodes 20. Thus, the semiconductor device according to this second embodiment is manufactured. FIG. 6D illustrates a part of the cross-sectional structure of the semiconductor device of this second embodiment. In FIG. D, one MOS transistor Q1 and parts of two MOS transistors Q2 and Q3 at each side of the complete MOS transistor Q1, respectively, are illustrated. The N+-type drain region 14 in each MOS transistors Q1 through Q3 is communicated to the aluminum layer 42 or a bit line. For example, in one the complete MOS transistor Q1, a channel region 43 is formed at the surface of the P-type region 31 under the gate electrode 20. As illustrated in FIG. 6D by a transverse dotted line, the channel region 43 is very narrow in comparison with the size of the gate electrode 20. Therefore, a high transconductance between the drain and the source is possible. The junction capacitance between the P-type region 31 and the N-type source region 16, between the P+-type channel cut region 60 and the N-type source region 16, and between the P-type substrate 10 and the N-type source region 16 forms a storage capacitance. It should be noted that, according to this second embodiment, the area required by one memory cell is also $4F^2$.

Figure 6E:
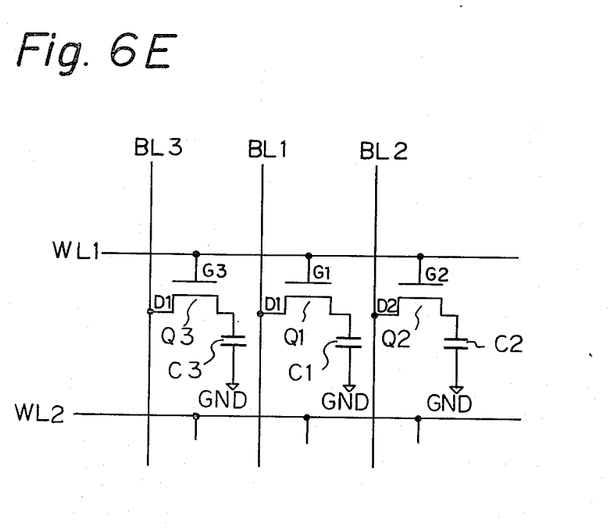
FIG. 6E is an equivalent circuit diagram of the semiconductor device of FIG. 6D.

FIG. 6E is an equivalent circuit diagram of the semiconductor device of FIG. 6D. In FIG. 6E, three gates G1, G2 and G3 of the three MOS transistors Q1, Q2 and Q3, respectively are each connected to a word line WL1. This means that the three gate electrodes 20 in FIG. 6D are respectively connected to the word line WL1 (not shown in FIG. 6D).

Three drains D1, D2 and D3 in FIG. 6E are connected to three bit lines BL1, BL2, BL3, respectively. This means that the three N+-type drain regions 14 in FIG. 6D are connected to the three bit lines BL1, BL2 and BL3, respectively. The capacitors C1, C2 and C3 correspond, respectively, to the capacitors between P-N junctions in FIG. 6D. The difference between the first embodiment and the second embodiment is that, in the first embodiment, the drains of two adjacent MOS transistors Q1 and Q2 are connected so that the structures of these cells are symmetric to each other, while in the second embodiment, the structures of all memory cells are substantially the same. In either case, the area of one memory cell is greatly reduced to 4 $F^2$ in these embodiments.

Figure 7:
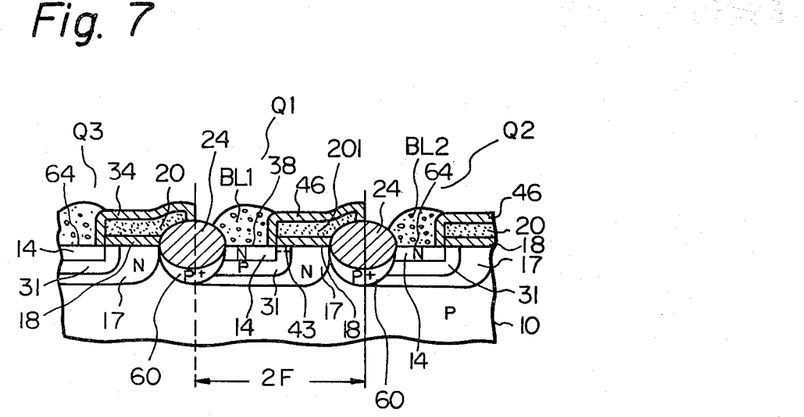
FIG. 7 illustrates a partial cross-sectional structure of a semiconductor device according to the third embodiment.

Although the N-type layer 160 is formed on the P-type silicon substrate 10 by epitaxial growth or impurity diffusion in the foregoing second embodiment, the N-type layer 160 may not be formed in the third embodiment which is a modification of the second embodiment. FIG. 7 illustrates a partial cross-sectional structure of a semiconductor device of the third embodiment. The difference between the structures of FIG. 6D and FIG. 7 is that, instead of the N-type layer 160 being formed by epitaxial growth or impurity diffusion, as in FIG. 6D, the N-type regions 17 are formed as in FIG. 7. The manufacturing steps of the third embodiment are as follows. First, P+-type channel cut regions 60 and isolation regions 24 are formed directly on a P-type silicon substrate 10. Then, gate oxide layers 18, gate electrodes 20, and windows 38 for impurity diffusion are formed in the same way as the above-described second embodiment. Then, N-type impurities are diffused through the windows 38 into the P-type substrate 10 to form N-type regions 17 which act as sources and charge-storage capacitors of the memory cells. Then, P-type impurities and N+-type impurities are sequentially diffused through the windows 38 to form P-type regions 31 and N+-type drain regions 14 in the same manner as the second embodiment. Thus, a semiconductor device having no N-type layer (160), formed by epitaxial-growth or impurity diffusion, is manufactured.

Figure 8A:
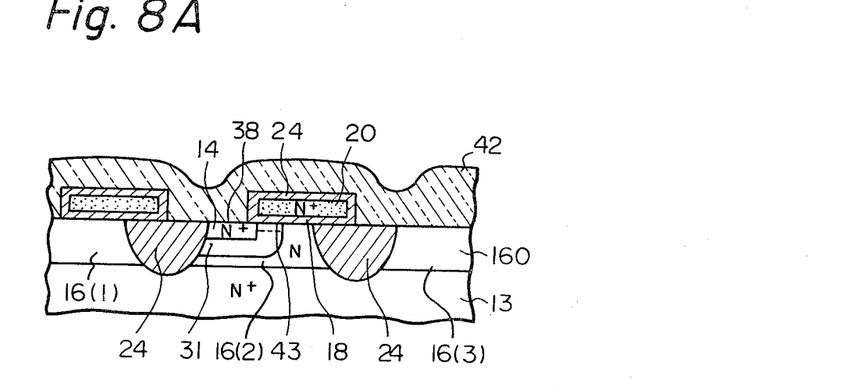
FIG. 8A illustrates a partial cross-sectional structure of a charge-pumping type semiconductor device or read-only memory according to the fourth or fifth embodiment.

Although each of the memory cells of FIG. 5H, FIG. 6D and FIG. 7 includes one MOS transistor and one capacitor which is a so-called 1-transistor RAM cell, the present invention is not restricted to this 1-transistor RAM cell. FIG. 8A illustrates a partial cross-sectional structure of a semiconductor device according to still another embodiment. This device of the fourth embodiment includes memory cells of a charge-pumping type. In a charge-pumping type memory cell, unlike the 1-transistor RAM cell the capacitor for storing information is not included. In FIG. 8A, an N-type layer 160 is formed on an N+-type silicon semiconductor substrate 13. Isolation regions 24 for isolating memory cells from each other are then formed, and thereby the N-type layer 160 is divided into a number of N-type source regions 16(1), 16(2), 16(3), . . . . The other manufacturing steps are the same as the semiconductor devices illustrated in FIG. 6D and FIG. 7.

Figure 8B:
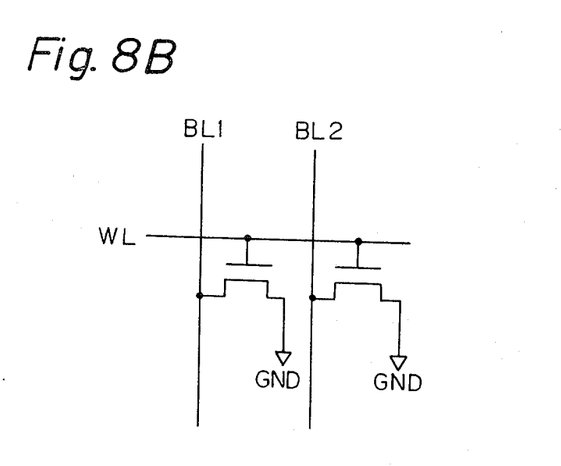
FIG. 8B is an equivalent circuit diagram of the semiconductor device of FIG. 8A when used as a charge-pumping type memory.

FIG. 8B illustrates an equivalent circuit diagram of the semiconductor device of FIG. 8A. As can be seen from FIG. 8B, no storage capacitor is included in this charge-pumping type memory device.

In order to store information of, for example, "1", in the desired memory cell by means of charge pumping, a current is conducted from, for example, the N+-type drain region 14 through the channel region 43 to the N-type source region 16(2), and then, the current is suddenly cut off. Some of the charges (i.e., electrons), flowing in the channel region 43 at the time the current is cut off will be coupled with majority carriers (i.e., holes) in the P-type region 31. As a result, the number of holes in the P-type region 31 will be decreased. That is, a charge pumping is effected. Because of the decrease of the holes, a well known back gate effect occurs and thereby, the threshold voltage for turning on the MOS transistor is lowered to a voltage lower than the threshold voltage when no back gate effect occurs. The information thus stored in the memory cell can be read out by detecting the change of the drain current due to the back gate effect. Erasure of the stored information can also be effected by means of avalanche breakdown. Since the area of the channel region 43 is very small in comparison with the area of the P-type region 31, the amount of charges injected from the channel region 43 into the P-type region 31 by the charge pumping is small in this fourth embodiment. However, since the back gate effect for varying the threshold voltage of the MOS transistor occurs as long as the potential of the P-type region 31 is changed, the small amount of charges injected into the P-type region 31 can cause the back gate effect. Therefore, a writing operation is performed reliably and is not affected by the amount of current flowing through the channel region 43. In addition, as compared with the known SOS-type charge pumping memory cell illustrated in FIG. 4, the charge-pumping type memory cell of this fourth embodiment has the advantages of a small channel region ensuring high speed response, a small area of 4 $F^2$, and a small leakage current. The small leakage current is ensured by employing silicon as the semiconductor substrate, because silicon bulk crystals include less imperfect lattices than silicon film on sapphire crystals do.

Figure 9:
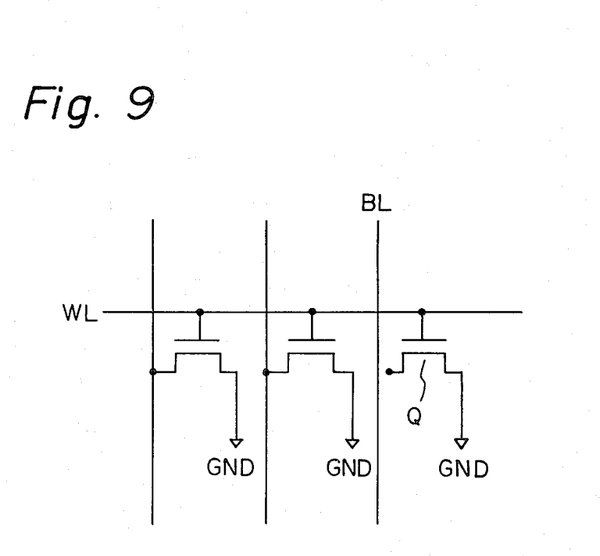
FIG. 9 is another equivalent circuit diagram of the semiconductor device of FIG. 8A when used as a read-only memory.

A read-only memory (ROM) device can also be provided, according to the fifth embodiment of the present invention. The structure of the ROM cell according to the fifth embodiment is substantially the same as the structure illustrated in FIG. 8A. The difference is that, in order to program the ROM device permanently, windows 38 of the desired memory cells are covered by insulating films not in FIG. 8A) and thereby the drains of the desired cells do not come in contact with the aluminum layer 42. FIG. 9 is an example of an equivalent circuit diagram of the ROM device. In FIG. 9, note that the drain of the MOS transistor $Q_2$ is not connected to the bit line BL.

From the foregoing description of the five embodiments, it will be understood that, according to the present invention, the size of a semiconductor memory cell is greatly reduced from 8 $F^2$ to the minimum value of 4 $F^2$.

Although N-channel MOS memory cells are used in the above-mentioned embodiments, the present invention is not limited to use with N-channel cells, and P-channel MOS memory cells may also be used.

I claim:

1. A semiconductor memory device including bit lines, word lines and a plurality of charge-storage capacitors operatively connected to corresponding ones of a plurality of MOS transistor memory cells formed on a semiconductor substrate of one conductivity type, each of said MOS memory cells comprising:
   a first region having an opposite conductivity type with respect to said semiconductor substrate and formed on said semiconductor substrate;
   a gate-oxide layer formed on said first region except on a window for diffusing impurities therethrough;
   a gate electrode formed on said gate-oxide layer and operatively connected to a corresponding one of said word lines;
   a second region having the same conductivity type as said semiconductor substrate and formed under said window by diffusing impurities through said window into said first region, said second region extending to a portion under a part of said gate electrode, and;
   a third region having the same conductivity type as said first region and formed on said second region by diffusing impurities through said window into said second region, and operatively connected to a corresponding one of said bit lines,
   said gate electrode covering the surface of said first region and said second region and, separated from said first and second regions by said gate-oxide layer,
   the junction capacitance between said first region and said second region and the capacitance between said first region and said semiconductor substrate form said charge-storage capacitor, and
   the size of each of said MOS memory cells being substantially equal to 4 $F^2$, where F represents both the minimum width of a patterning line and the minimum width of the spacing between two adjacent patterning lines.

2. A semiconductor memory device as claimed in claim 1 wherein a channel region is to be formed under said gate-oxide layer and between said first region and said third region.

3. A semiconductor memory device as claimed in claim 1 wherein said first region and said third region respectively constitute a source region and a drain region of said MOS transistor.

4. A semiconductor memory device as claimed in claim 3 wherein the plurality of said memory cells are arranged in a matrix and connected according to a pattern of rows defining bit lines and columns defining word lines in which said gate electrode of each said memory cell along a given column is connected to a single word line; said drain region of each said memory cell along a given row of said matrix is connected to a single bit line, said source region of each said memory cell in said matrix is connected to a ground.

5. A semiconductor memory device as claimed in claim 4 wherein said gate electrode of each said memory cell along a given row is connected to a separate word line.

6. A semiconductor memory device as claimed in claim 1 wherein two adjacent memory cells have symmetric structures.

7. A semiconductor memory device as claimed in claim 6 wherein said third region is common to two adjacent memory cells.

8. A semiconductor device according to claim 1, wherein said plurality of said memory cells are changed in pairs such that respective third regions of each of said pairs of memory cells are adjoining.

9. A semiconductor memory device as claimed in claim 1 wherein all of said memory cells have substantially the same structures.

10. A semiconductor memory device as claimed in claim 9 wherein said first region is an epitaxial-growth region.

11. A semiconductor memory device as claimed in claim 10 wherein said second region is formed on said first region.

12. A semiconductor memory device as claimed in claim 9 wherein said first region is an impurity-diffusion region.

13. A semiconductor memory device as claimed in claim 12 wherein said second region is formed on said first region.

14. A semiconductor memory device as claimed in claim 9 wherein said first region is an impurity-diffusion region formed by diffusing impurities through said window.

15. A semiconductor memory device including bit lines, word lines and a plurality of memory cells formed on a semiconductor substrate of one conductivity type, each of said memory cells comprising:
    a first region having the same conductivity type as said semiconductor substrate and formed on said semiconductor substrate;
    a gate-oxide layer formed on said first region except on a window for diffusing impurities therethrough;
    a gate electrode formed on said gate-oxide layer and operatively connected to a corresponding one of said word lines;
    a second region having an opposite conductivity type as said semiconductor substrate and formed under said window by diffusing impurities through said window into said first region, said second region extending to a portion under a part of said gate electrode, and;
    a third region having the same conductivity type as said first region and formed on said second region under said window by diffusing impurities through said window into said second region, and operatively connected to a corresponding one of said bit lines;
    an isolation region, formed in contact with said gate-oxide layer, for isolating said memory cells from each other,
    said gate electrode covering the surface of said first region and said second region, and separated from said first and said second regions by said gate-oxide layer,
    the size of each of said memory cells being substantially equal to 4 $F^2$, where F represents both the minimum width of a patterning line and the minimum width of the spacing between two adjacent patterning lines.

16. A semiconductor memory device as claimed in claim 15 wherein said second region is formed on said first region.

17. A semiconductor memory device as claimed in claim 14 or 15 wherein a channel region is to be formed under said gate-oxide layer and between said first region and said third region.

18. A semiconductor memory device as claimed in claim 14 or 15 wherein each of said memory cells includes one MOS transistor.

19. A semiconductor memory device as claimed in claim 17 wherein said first region and said third region respectively constitute a source region and a drain region, of said MOS transistor.

20. A semiconductor memory device as claimed in claim 19 wherein the plurality of said memory cells are arranged in a matrix and connected according to a pattern of rows defining bit lines and columns defining word lines, in which said drain region of each said memory cell along a given row is connected to a single bit line, said gate electrode of each said memory cell along a given row is connected to a separate word line, and said source region of each said memory cell in said matrix is connected to a ground.

21. A semiconductor memory device as claimed in claim 20 wherein the drain region of predetermined memory cells are not connected to said bit line.

22. A semiconductor memory device as claimed in claim 18 wherein said first region is an epitaxial-growth region.

23. A semiconductor memory device as claimed in claim 18 wherein said first region is an impurity-diffusion region.

24. A semiconductor memory device as claimed in claim 23 wherein said second region is formed on said first region.

25. A semiconductor memory device as claimed in claim 18 wherein said first region is an impurity-diffusion region formed by diffusing impurities through said window.

26. A semiconductor memory device as claimed in claim 25 wherein said second region is formed on said first region.

27. A semiconductor memory device as claimed in claim 18 wherein each memory cell is a charge-pumping type memory cell.

28. A semiconductor memory device as claimed in claim 18 wherein the windows of predetermined memory cells are covered with insulating films.

29. A semiconductor memory device as claimed in claim 18, where said memory device is a read-only memory.

30. A semiconductor memory device as claimed in claim 18 wherein all of said memory cells have substantially the same structures.

* * * * *

UNITED STATES PATENT AND TRADEMARK OFFICE
CERTIFICATE OF CORRECTION

PATENT NO. : 4,455,566
DATED : June 19, 1984
INVENTOR(S) : SAKURAI

It is certified that error appears in the above-identified patent and that said Letters Patent is hereby corrected as shown below:

On the title page,

[56] "Tasch et al." should be --Tasch, Jr. et al.--;
    "Curran et al." should be --Curran--.
Column 5, line 63, "P3-type" should be --p+-type--.
Column 7, line 42, "43" should be --42--;
    line 64, "14(12)," should be --14(2)--.
Column 10, line 53, "not" should be --(not shown--.
Column 14, line 12, "18" should be --14--;
    line 15, "18" should be --14--;
    line 18, "18" should be --25--.

Signed and Sealed this

Twentieth Day of November 1984

[SEAL]

Attest:

GERALD J. MOSSINGHOFF

*Attesting Officer*  *Commissioner of Patents and Trademarks*